US005994818A

United States Patent [19]

Abramov et al.

[11] Patent Number: 5,994,818

[45] Date of Patent: Nov. 30, 1999

[54] DEVICE FOR TRANSFERRING ULTRASONIC ENERGY INTO A LIQUID OR PASTY MEDIUM

[75] Inventors: Vladimir Abramov, Stuttgart, Germany; Vyacheslav Alenichev, Moskau, Russian Federation; Leonid Makarov, Moskau, Russian Federation; Andrew Ruhman, Moskau, Russian Federation

[73] Assignee: Tech Sonic Gesellschaft Fur Ultraschall-Technologie m.b.H., Germany

[21] Appl. No.: 09/051,876

[22] PCT Filed: Oct. 17, 1996

[86] PCT No.: PCT/EP96/04502

§ 371 Date: Jan. 21, 1999

§ 102(e) Date: Jan. 21, 1999

[87] PCT Pub. No.: WO97/15404

PCT Pub. Date: May 1, 1997

[30] Foreign Application Priority Data

Oct. 20, 1995 [DE] Germany ........................... 195 39 195

[51] Int. Cl.[6] ........................................ H01L 41/08

[52] U.S. Cl. ................ 310/325; 310/323.01; 310/323.18

[58] Field of Search .............................. 310/323.01, 325, 310/334, 323.18; 134/1, 184; 366/113, 118, 120, 127

[56] References Cited

U.S. PATENT DOCUMENTS

| | | | |
|---|---|---|---|
| 4,016,436 | 4/1977 | Shoh | 310/334 X |
| 4,537,511 | 8/1985 | Frei | 366/127 |

FOREIGN PATENT DOCUMENTS

| | | |
|---|---|---|
| 2354827 | 1/1978 | France . |
| 3902765 | 1/1991 | Germany . |

*Primary Examiner*—Mark O. Budd
*Attorney, Agent, or Firm*—Pendorf & Cutliff

[57] ABSTRACT

A device (10) for transferring ultrasonic energy into a liquid or pasty medium, the device consisting of the following functional elements: a) an AC generator (35) designed for frequencies between 1 kHz and 100 kHz, b) a magnetostrictive or piezoelectric transducer (20) controlled by the output voltage of the AC generator to execute high-frequency (longitudinal) mechanical oscillations, c) a cylindrical waveguide (23) which is excited by the transducer to execute longitudinal resonant oscillations and d) a tubular cavity resonator (24) which is acoustically coupled to the waveguide and which converts the longitudinal resonant oscillations into oscillations transverse to its longitudinal axis (26'), the oscillation energy of the resonator being transferred into the medium (11) which is to be exposed to the ultrasonic energy. The cavity resonator (24) is designed so that the resonance condition is fulfilled for both longitudinal and transverse natural oscillations of its case (36).

9 Claims, 4 Drawing Sheets

DEVICE FOR TRANSFERRING ULTRASONIC ENERGY INTO A LIQUID OR PASTY MEDIUM

BACKGROUND OF THE INVENTION

1. Field of the Invention

The invention concerns a device for transferring or transmitting ultrasonic energy into a fluid or pasty medium, and with the further, characteristics particular to this species of invention. A device of this type is known from U.S. Pat. No. 4,016,436.

2. Description of the Related Art

In this known device a wave guide is provided on one side of a tubular shaped cavity resonator which, by means of a piezo-electric transducer, which for its part converts electrical alternating current output signals of an alternating current generator into longitudinal mechanical oscillations, is capable of being brought or excited to resonant longitudinal oscillations. On a flange shaped area on this transducer the cavity resonator is mechanically rigidly connected and acoustically coupled.

In a further device of the above described type (U.S. Pat. No. 5,200,666), which is substantially a functional analog of the first described, respective transducers transmit ultrasound energy at both ends of a tubular resonator, which is designed for conversion of longitudinal oscillations into transverse oscillations.

It is also known (U.S. Pat. No. 4,537,511), to use a tubular cavity resonator, which is closed on both ends and from one side is impinged by ultrasound from a coupled transducer.

In all these devices the length of the tubular cavity resonator is almost always selected to be in a first approximation described according to the equation, $$L=nc_0/2f_r \tag{1}$$

in which n represents a whole number, with $c_0$ being the oscillation frequency in a steel type resonator and with $f_r$ being the mechanical resonance frequency of the wave guide utilized for introduction of ultrasound in the resonator and which is acoustically coupled with the transducer. The oscillation frequency $c_0$, is here described by the relationship, $$c_0 = \sqrt{E/\rho}$$

in with E being the modulus of elasticity (Youngs modulus) and with ρ being the specific weight of the resonator material.

In order, in such ultrasound devices, to convert the greatest possible proportion of electrical energy into utilizatable sound energy, it is also known (FR-A-2 354 827 and EP-A-0 044 800), to so attempt to arrange or design the cavity resonator, so that the longitudinal as well also the transverse natural oscillating frequency of its jacket satisfies the resonance conditions.

In such devices the oscillating effective element is constructed as a three dimensional tubular cavity resonator, in which the propagation velocity $V_x$ and $v_r$, and therewith also the wave lengths $\lambda_x$ and $\lambda_r$ of the oscillations, which are associated with deflection in the direction of the longitudinal axis (x-direction) and radial thereto, are necessarily different. Those respective ultrasound waves, of which the deflection is in the direction of the longitudinal axis (x-direction) of a resonator, of which the axial length is selected to correspond to a whole number multiple of the half wave length ($\lambda_x/2$), do not contribute to the outward radiation of ultrasound energy, however prevent a buildup of ultrasound energy and facilitate a good even form or shape of the distribution of the ultrasound energy over the total-axial-resonator length, while those ultrasound waves, of which the oscillation form of the resonator corresponds with deflection radial to the resonator-length axis and to its outer surface, mediate an effective radiating out of ultrasound energy in the environment.

Such an arrangement or design, given that the characteristics of the resonator wall material are pre-determined, requires a very precise coordination of the geometric dimensions of the resonator, namely its length L, its outer diameter $D_0$ and its wall thickness δ. This relationship can in the case of pre-determined values of the outer diameter $D_0$ and the wall thickness δ of course be achieved by adaptation or adjustment of the resonator length L, which however as a rule requires time consuming experiments or testing and only then is justifiable, when a subsequently larger number of such devices can be built following this experimentation to determine optimal length. Special devices which are only constructed in small quantities are thus very expensive.

From DE-33 16 353 A1 it is known, in connection with a cleaning device, in which the material to be cleaned, for example a length of textile material, is exposed to an ultrasound field, to use a so-called broad horn for transmission our application of ultrasound into a fluid bath through which the length of textile material is transported, which by means of an ultrasound transmitter corresponds is excited to resonate both in the longitudinal direction—the excitation direction—as well also in the thereto right angled transverse direction, in which the expansion or spreading of the broad horn corresponds at least approximately to the breadth of the textile material to be cleaned corresponds. This broad horn is designed as a flat rod-shaped, massive transmission body ("Sonotrode"), which corresponds in the excitation direction measured length to the half ultrasound-wave shape ($\lambda/2$) and in transverse direction measured breadth corresponds to a whole number multiple of this value; the thickness of the plate shaped broad horn measured between the broad longitudinal surface is significantly smaller than the half ultrasound wave length, which in longitudinal-and transverse direction has the same value. Through this dimensioning of the broad horn there should, which in principle is also possible, over the total breadth ($n\cdot\lambda/2$) an even shaped broadcasting characteristic of the broad horn and therewith also be achieved the even good cleaning of the length of material; however, the Q-factor (usable ultrasound-energy/electrical excitation energy), in comparison with ultrasound devices, which work with hollow space resonator-excitation, is comparatively small, so that very high output and correspondingly expensive ultrasound transmitters must be utilized, which makes the operation of this known type of cleaning device, which works with block-shaped massive broadcast elements, significantly more expensive.

It is the object of the invention, beginning with a device of the type known in the art, to provide a design of a device which produces a desirable high transmission operating effectiveness, and, after it has once been designed, does not, or at least not to any significant degree, have a post-working or reworking requirement, in order to be configured for a operation with optimal working effectiveness, and in particular to provide a device, which with a predetermined construction and type of coupling or transmission provided for excitation to oscillation, for its part by a transducer driven wave guide on a hollow tubular cavity resonator functions with a operating effectiveness which is a close to the optimal operating effectiveness.

This task is solved for devices in which the tubular cavity resonator is "strongly", that is mechanically substantially rigidly, coupled with the wave guide, according to the characterizing portion of Patent claim 1, thereby that the resonator length L is selected according to the relationship the formula $$L = \frac{nc_0}{2fr}\left[1 - 4v^2\left(\frac{Do - \delta}{Do}\right)^2\right] \tag{2}$$

wherein with v the Poisson transverse contraction co-efficient of the tubular cavity resonator-material, with δ the wall thickness of the tubular cavity resonator and with $D_0$ the outer diameter of the tubular cavity resonator are indicated.

The hereafter provided deviations from the relationship or equation (1) can be very small, so that the equation or relationship (2) with respect to the relationship for equation (1) produces only a minimal improvement, but can however in practical cases also deviate by about approximately 40% from the result obtainable through the relationship (1), so that, in comparison with such a case, the construction according to the relationship (2) produces a substantially better result.

In a preferred embodiment of a device according to the invention there is a "weak" coupling of the tubular shaped cavity resonator and the wave guide provided, wherein weak coupling means that between the resonant oscillations of the cavity resonator, on the one hand, and the resonating-longitudinal-oscillations of the wave guide, on the other hand, a significant phase difference exists. Such a weak coupling can for example be realized thereby, that the wave guide is swingingly or flexible coupled with the cavity resonator via a yieldable spring element, which may have the form of a disc spring, is pivotably coupled with the cavity resonator. For this case, in which the wave guide must have in advance carried out a multiplicity of longitudinal oscillations, before the hollow cavity resonator is brought into resonance, that is, oscillates with maximal amplitude, the length $L_w$ thereof is provided according to the relationship $$L_w = \frac{nc_0}{2fr}\left[1 - 4v^2\left(\frac{Do - \delta}{Do}\right)^2\right] + \frac{Co}{2\pi fr}\left[1 - 4v^2\left(\frac{Do - \delta}{Do}\right)^2\right]\text{arctg}\frac{\delta(do - \delta)}{\delta_1(Do - \delta_1)} \tag{3}$$

when at the same time or simultaneously the ultrasound is coupled into the resonator only from one side.

For a likewise given case of weak acoustic coupling between the cavity resonator and the wave guide, wherein the cavity resonator is acted upon from both its ends equiphasally with oscillation energies produced by two transducers, its length $L_w$ is determined by the relationship $$L'_w = \frac{(n - 1)Co}{2fr}\left[1 - 4v^2\left(\frac{Do - \delta}{Do}\right)^2\right] + \frac{Co}{\pi fr}\left[1 - 4v^2\left(\frac{Do - \delta}{Do}\right)^2\right]\text{arctg}\frac{\delta(Do - \delta)}{\delta(Do - \delta_1)} \tag{4}$$

By the characteristics of claims 4 through 6 conditions are given, in which satisfaction of the oscillation form of the cavity resonator is completely radially symmetrical (symmetry group $C_\infty$), that is, the radial deflections in the plane extending at right angle to the central longitudinal is always equiphasic, or as the case may be the resonator in each transverse section plane is circular shaped, the cross-section of this circle however along the length of the resonator is spatially periodically varied, and in each cross-sectional plane of the resonator diameter time-wise varies periodically.

BRIEF DESCRIPTION OF THE DRAWINGS

By the characteristics indicated in claims 7, 8 and 9 additional conditions are given, which when satisfied oscillate the resonator in its natural periodicity, of which the symmetry orientation is pre-calculable defined by the dimensional measurements of the resonator.

Further details and characteristics of the invention can be seen from the description of three embodiments according to the drawings. There are shown:

In FIG. 1 there is overall with 10 a device indicated, by means of which ultrasound can be transmitted into a fluid medium 11, which can be, for example, a thin fluid, or a pasty or fluid-like material, for example, powder.

Figure 1:
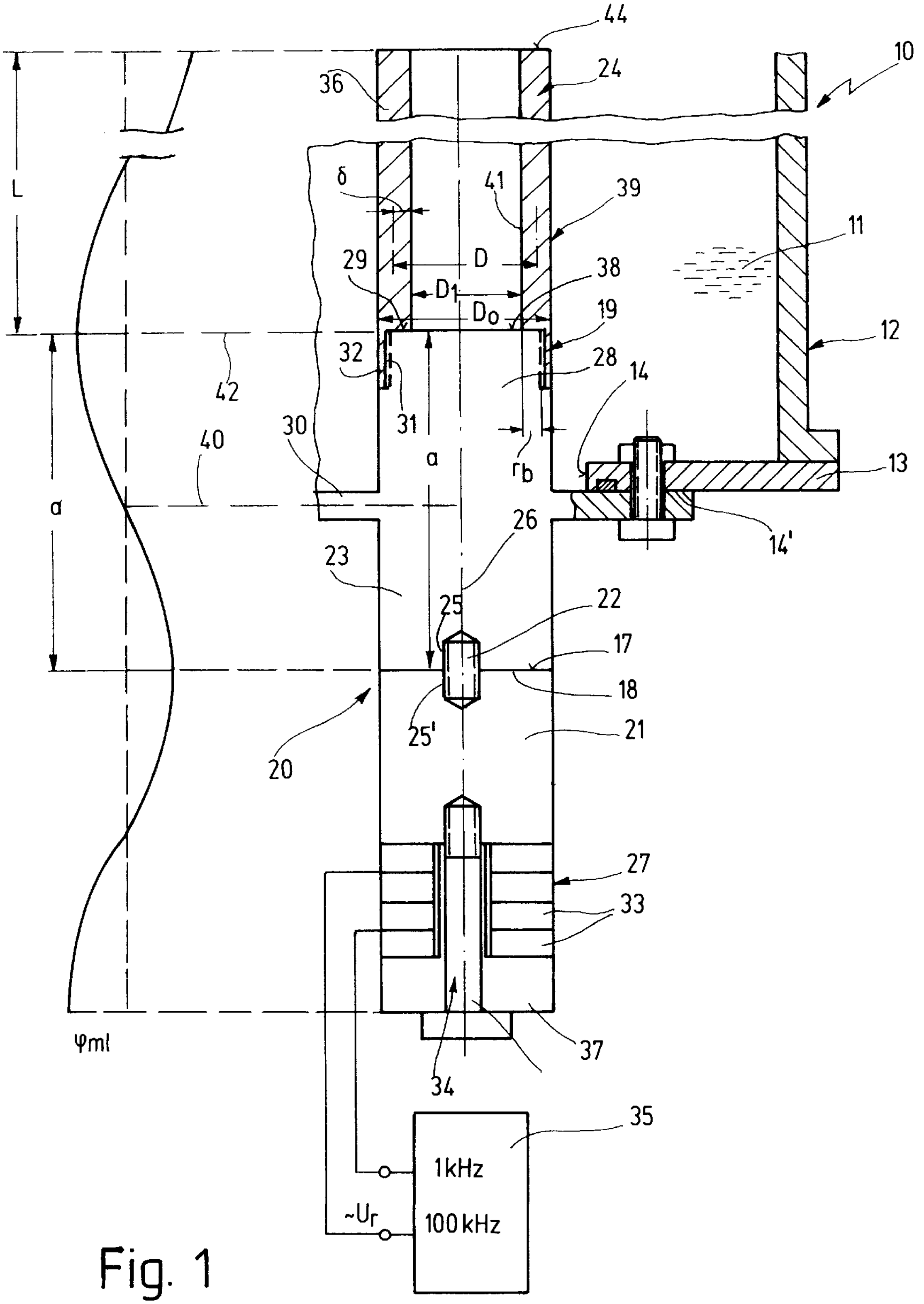
FIG. 1 an embodiment of an inventive device for strong coupling between cavity resonator and transducer, in schematic multiple longitudinal section representation.

The device 10 includes a transducer indicated generally with 20, which converts energy offered in the form of alternating electric current into (ultra) sonic energy and offers this sonic energy in the form of produced longitudinal oscillations of a cylindrical-shaped transducer block 21; an overall with 24 indicated longitudinal extending cylindrical-tubular shaped hollow cavity resonator; and a wave guide 23 acoustically coupled with the transducer, for its part circular cylindrical-block shaped thorough which the longitudinal oscillations produced by the transducer are transmittable to the jacket 36 of the cavity resonator 24. The transducer 20, the wave guide 23 and the cavity resonator 24 are provided co-axial in their sequence along a common central longitudinal axis 26 and mechanically fixedly connected with each other. With respect to the fixed connection of the wave guide 23 with the transducer block 21 a central threaded bolt 22 is provided, which with the respectively opposing oriented threads 25 and 25' of the wave guide 23 or as the case may be transducer block 21 are in meshing engagement, so that these by rotating with respect to each other about the central longitudinal axis with their each other oppositely lying ring face surfaces 17 and 18 are rigidly urgable against each other.

For mechanical rigid connection of the wave guide 23 and the hollow cavity resonator 24 a sleeve nut is provided on the wave guide side end section 19, which is in enmeshing engagement with an it facing end section 28 situated outer threading 31, so that the cavity resonator 24 by rotation about the central longitudinal axis 26 with respect to the wave guide 23 is force fittingly rigidly connectable therewith, whereupon the hollow space cavity 24 supports itself with a ring face surface 29, which extends radially between the thread coat 32 and the inner jacket surface 41 of the resonator coat 36, on which the hollow cavity resonator 24 facing end face surface 38 of the threaded section 28 of the wave guide 23 axially supports. By the thereby obtained mechanical connection of the cavity resonator 24 and the wave guide 23 there are between these functional elements of the device an oscillation coupling in the sense of a strong acoustic coupling produced, wherein the radial breadth $r_b$ of the ring face surface 29 of the cavity resonator jacket 36, with the this on the resonators side end face surface 38 of the wave guide 23 axially is supported, at least an approximately the 0.7 factor value the thickness δ of the resonator material corresponds, which is given by the relationship $$\delta=(D_0-D_1)/2$$

in which with $D_0$ the outer diameter and with $D_1$ the inner diameter of the resonator jacket 36 of the hollow resonator 24 is characterized. Also the diameter of the wave guide has the value corresponding to the outer diameter $D_0$ of the cavity resonator 24.

The transducer 20 includes as electromechanic current/oscillation transformer or converter an overall with 27 indicated piezo-electric column which by activation with an alternating current in the direction of the central longitudinal axis 26 extending "thick" oscillation, that is, with longitudinal length changes, is excitable, which via the transducer block 21 and the fixedly or rigidly with this connected wave guide 23 upon the jacket 36 of the hollow cavity resonator 24 is carried over. The piezo-electric coil 27 is by a multiplicity of piezo-ceramic ring sections 33 realized, which by means of a central tensioning screw 34 between a stable tension ring 37 and the transducer block 21 fixedly or rigidly is clamped in and by parallel control or activation or driving with the alternating current $U_r$ of a alternating current generator 35 to eguiphasic thick oscillations is excitable. The alternating current output of the alternating current generator is adjustable upon the resonance frequency of the longitudinal self-oscillation or natural oscillation of the wave guide 23, so that this resonantly is excitable to such oscillations.

In the embodiment selected for explanation of the device 10 the medium 11 to be treated by ultrasonication is received in a cylindrical pot-shaped reactor container indicated overall with 12, which on its lower side is closed off by the ring disk shaped floor plate 13, which has a central, circular opening 14 and of which the outer side according to the representation of FIG. 1 lower edge area 14' of the device 10 is securable by means of a radial flange 30 of the wave guide 23, which via a screw-nut connection represented schematically, which is provided in axial symmetrical orientation with respect to the central longitudinal axis 26 of the device 10.

The radial flange 30 of the wave guide 23 is, in this longitudinal direction, in the middle between the resonator side end face surface 38 and the transducer side ring face surface 17 of the wave guide 23 provided, so that the right angular to the central longitudinal axis 26 of the device 10 extending central plane 40 of the flange 30 upon resonator oscillation activation of the wave guide 23 represents a nodal plane of its longitudinal oscillations.

In the wave guide 23 excited or activated longitudinal oscillations, which are associated with the, in the direction of the central longitudinal axis 23 extending deflections of its end surfaces 17 and 38, wherein these deflections, viewed along the central longitudinal axis 26 of the wave guide 23, are always directed against each other, the cavity resonator 24 is also excited to the longitudinal oscillations, with which the on the basis of the herewith connected or associated transverse contractions of the resonator jacket 36 also transversal, that is radial to the central longitudinal axis 26 directed jacket-oscillations proceed, by means of which the ultrasonication energy via the outer and inner cylindrical jacket surfaces 39 and 41 in radial direction is transferable "sonically" to the medium to be dissolved by the ultrasonication treatment.

The upward propagation velocity $v_x$ and $v_r$ of the jacket oscillations in longitudinal and transverse directions and therewith also the wave lengths $\lambda_x$ and $\lambda_r$ are herein in characteristic manner, that is, each according to geometry of the resonator 24 and type of the resonator-material, differentiated or different.

In order to achieve a high as possible operational effectiveness of the conversion of the electrical energy into sonic capacity, which is transmittable into the medium 11, the wave guide 23 is driven in its mechanical resonance frequency $f_r$, wherein the half wave length of the wave guide excitable longitudinal oscillations is the same as the middle or central, in axial direction measured separation A of its end face surfaces 17 and 38. The alternating current generator 35 is adjustable insofar, that the resonant excitation of the wave guide 23 is ensured. For attaining the desired high working effectiveness of the conversion of electrical capacity in mechanical sonic capacity also the cavity resonator 24 is upon the resonance frequency $f_r$ of the wave guide 23 determined or adjusted and hereby also indicating or predetermined arranged, so that the resonance condition is satisfied both for the longitudinal as well also for the transverse oscillation modes of its jacket 36.

For this there is from the coupling plane 42 at which the resonator side end face surface 38 of the wave guide 23 on the one, according to the representation in FIG. 1 lower ring shaped end surface 29 of the cavity resonator 24 is supported and thereby or hereby fixedly onto this is pressed, to the upper, free end face surface 44 of the cavity resonator 24 measured length L of the same according to the relationship $$L=\frac{nc_0}{2fr}\left[1-4v^2\left(\frac{Do-\delta}{Do}\right)^2\right] \tag{2}$$

In this relationship the symbols have the following meanings:

V: Poissonic transverse contraction coefficient
$D_0$: Outer diameter of the cavity resonator 24
: Wall thickness of the jacket 36 of the cavity resonator
$f_r$: Resonance frequency of the wave guide 23
n: Whole numeral ≧1
$c_0$: Sound velocity in the round shaped resonator of which the inner side is given by the relationship $$c_0=\sqrt{\frac{E}{\rho}}$$

in which the E coefficient of elasticity (Youngs modulus) of the material of the cavity resonator 24 and with ρ the thickness thereof is indicated.

In order with such an arrangement of the cavity resonator 24 to achieve a defined, axial full symmetric radiating out characteristic of the type such that the jacket (36) carries out radial oscillation movements, in which in nodal plane of the same the middle cross-section D of the cavity resonator jacket 36 remains satisfied and otherwise via or over the length L of the cavity resonator sinusoidal varies, wherein in each cross-sectional plane of the transverse section remains circular shaped, even when in cross-section sideways varying, is the cavity resonator 24 further so arranged, that in addition to the equation (2) also to the equation $$L=\frac{n\pi Do\left[1-4v^2\left(1-\frac{\delta}{Do}\right)^2\right]\left(1-\frac{\delta}{Do}\right)}{2\sqrt{1-v^2}} \tag{5'}$$

is satisfied.

For explanation of the fully symmetric oscillation form resonator oscillations of the cavity resonator 24, which result, when this according to the equation (2) and (5') is designed, reference is made to FIG. 3, in which the bi-radial outward directed arrows 46 and radial inward directed arrows 47 show the deflections of the resonator jacket 36 respective of its central longitudinal axis 26, which the resonator jacket 36—outside of the nodal plane—experiences with maintenance of its cylindrical cross-sectional shape.

Figure 3A:
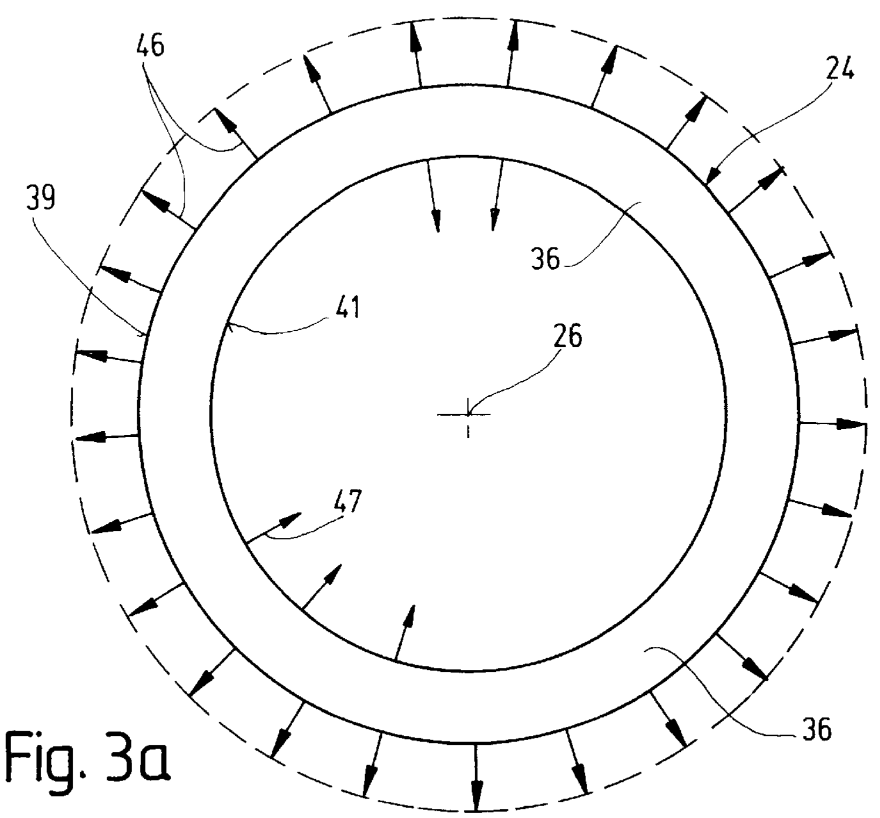
FIG. 3*a* and *b* possible oscillation types of the cavity resonator for defined geometric designs of the same and FIG. 4 an embodiment with activation of the cavity resonator by means of two transducers activated in phase opposition.

Alternative to the in FIG. 3*a* viewable, axial full symmetric oscillation form the hollow cavity resonator 24 can also be excited to resonate to natural oscillation by lower or lesser axial symmetries, for example to natural oscillation period of its jacket 36, which with respect to the central longitudinal axis 26 has a 3-fold symmetry, of the type, that, viewed in circumference direction of the jacket 36, equal distance from each other arranged 60-part sections 48, 49 and 51 of the resonator jacket 36 exhibit outwardly directed deflections, while the between the respective two of these part areas associated complimentary 60-part areas 52, 53 and 54 of the resonator jacket 36 radial inwards directed deflections exhibit, which through the appropriate or corresponding direction arrows 56 and 57 is indicated. An oscillation relationship of the cavity resonator 24 with the type of oscillation shapes axial symmetric defined number factor p, wherein for the oscillation shape or form according to FIG. 3*b* satisfies p=3, is thereby achievable that the cavity resonator 24 according to FIG. 1 is so designed, that additionally to the relation (2) also the relation $$L=\frac{n\pi^2\sqrt{3}\left[1-4v^2\left(1-\frac{\delta}{Do}\right)^2\right]\left(1-\frac{\delta}{Do}\right)^2 Do}{P^2\left(\frac{\delta}{Do}\right)\sqrt{1-v^2}} \tag{6'}$$

is satisfied.

Figure 2:
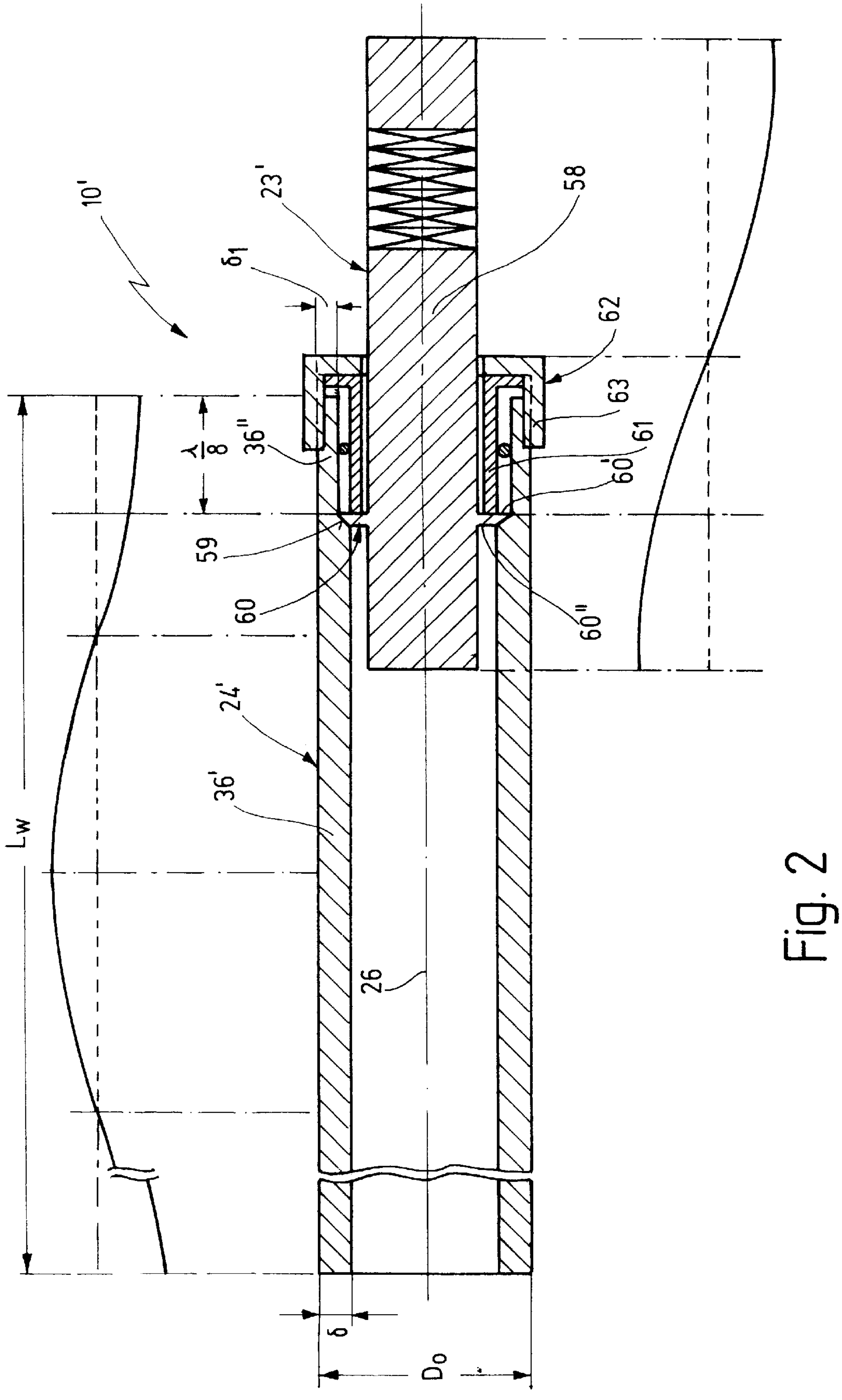
FIG. 2 an embodiment of a device with weak coupling between cavity resonator and transducer.

For explanation of a further illustrative embodiment of a device employable analogously to the device 10 according to FIG. 1, reference is now made to FIG. 2, in which, for purposes of simplification, the device 10' is essentially represented by a transducer 20, a wave guide 23' and the with this acoustically coupled cavity resonator 24' as well as for the acoustic coupling provided assembly and coupling elements. The device 10' according to FIG. 2 differs from the device 10 in FIG. 1 in the functional respect essentially therein, that the cavity resonator 24' is connected with the wave guide 23' in the sense of a "weak" acoustic coupling, which brings about, that the cavity resonator 24' and the cylindrical—staff or rod shaped block 58 of the wave guide 23' can carry out longitudinal relative movement with respect to each other, wherein this weak coupling leads to the result, that in the resonance case, the longitudinal movement of the cavity resonator 24' have significant phase shift with respect to the longitudinal oscillations of the wave guide 23'. The—acoustically weak—coupling of the tubular shaped cavity resonator 24' and the staff shaped block 58 of the wave guide 23' is obtained by supporting of a radially tapering support flange 60 in an outward radial area conically complimentary extending inner support surface 59 of the cavity resonator 24', which between the jacket section 36' and 36" variably thickness δ and $\delta_1$, mediates or interposes, wherein or whereby the outer diameter $D_0$ of the two segments 36' and 36" is the same. The section 36" which has the smaller wall thickness $\delta_1$, viewed or considered in the direction of the central longitudinal axis 26 of the device 10', has an axial recess, which corresponds to ⅛ of the wave length $\lambda_x$, which corresponds in the case of resonator oscillation excitation of the cavity resonator 24' the wave length $\lambda_x$ of the longitudinal oscillation excitation in the cavity resonator 24'. According to the longitudinal section representation of FIG. 2 knife edged or as the case may be wedge or cotter shaped designed radially outer edge 60' of the support flange 60, which supports itself axially on the conical support surface 59 of the cavity resonator 24', goes out from a radially inner, ring disk shaped flange area 60" which for its part is formed as a single piece with the staff shaped block 58 of the wave guide 23'. The inner half of this ring disk shaped part area 60" engages one of the thinner wall sections 36" of the cavity resonator jacket 36 coaxially and in thinner radial separation from the this enclosing or circumscribing, tubular shaped distance piece 61 on, which by means of a sleeve nut 62, which with a outer threading 63 of the thinner walled segment or section 36" the thickness 61 the resonator jacket 36' in meshing engagement is and upon a predetermined value the axial force is adjustable, with which the wave guide 23' axially supports itself via its support flange 60 on the conical support surface 59 of the cavity resonator 24', against the ring disk shaped flange area 60" is force or urged by the radially outwardly tapering design of the support flange 60 along this the characteristic of a spring, similar to that of a disc spring, which the axial yielding connection—coupling—of the cavity resonator 24' with the staff shaped block 58 of the wave guide 23 interposes or mediates.

In the device 10', is compared with the device 10 according to FIG. 1, larger amounts or values of the radial oscillation amplitudes of the cavity resonator 24' are achievable, that is, a higher Q-factor, which overall or generally by the relationship of the radiated out acoustic yield to the therefore necessary—electrical—excitation or activation yield is defined.

In order to adjust in the device 10' the condition or relationship suitable for the achievement of the highest possible Q-factor, namely to so design the cavity resonator 24', that in this both for longitudinal as well also as for transverse oscillations the resonance condition is satisfied, the length $L_w$, of the cavity resonator 24' is by the relationship or equation $$L_w=\frac{nc_0}{2fr}\left[1-4v^2\left(\frac{Do-\delta}{Do}\right)^2\right]+ \frac{Co}{2\pi fr}\left[1-4v^2\left(\frac{Do-\delta}{Do}\right)^2\right.\text{arctg}\frac{\delta(do-\delta)}{\delta_1(Do-\delta_1)} \tag{3}$$

selected.

Should the cavity resonator 24' of the device 10' oscillate in the case of resonance in the axial full symmetrical oscillation form (FIG. 3*a*), it is so arranged that its length $L_w$, additionally to condition (3) also satisfies the condition $$L_w = \frac{\left(n - \frac{1}{4}\right)\left[1 - 4v^2\left(1 - \frac{\delta}{Do}\right)^2\right]\left(1 - \frac{\delta}{Do}\right)\pi Do}{2\sqrt{1 - v^2}} \tag{5''}$$

Figure 3B:
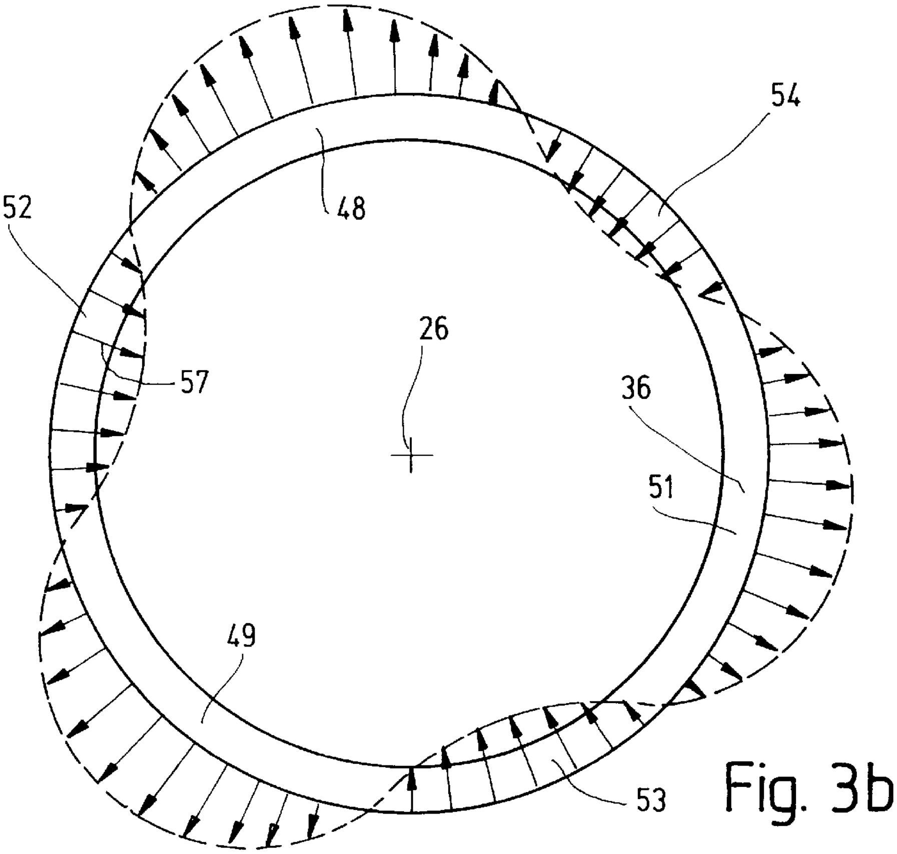

Should on the other hand in the device 10' oscillation forms of lower axial symmetry be excitable, such as for example described on the basis of FIG. 3*b*, so is this by a arrangement of the cavity resonator 24' substantially achieved, that this in addition to equation (3) also satisfies the condition $$L_w = \frac{\left(n - \frac{1}{4}\right)\pi^2\sqrt{3}\left[1 - 4v^2\left(1 - \frac{\delta}{Do}\right)^2\right]\left(1 - \frac{\delta}{Do}\right)^2 Do}{P^2\sqrt{1 - v^2}\left(\frac{\delta}{Do}\right)} \tag{6''}$$

in which with p represents a whole number ≧1.

Figure 4:
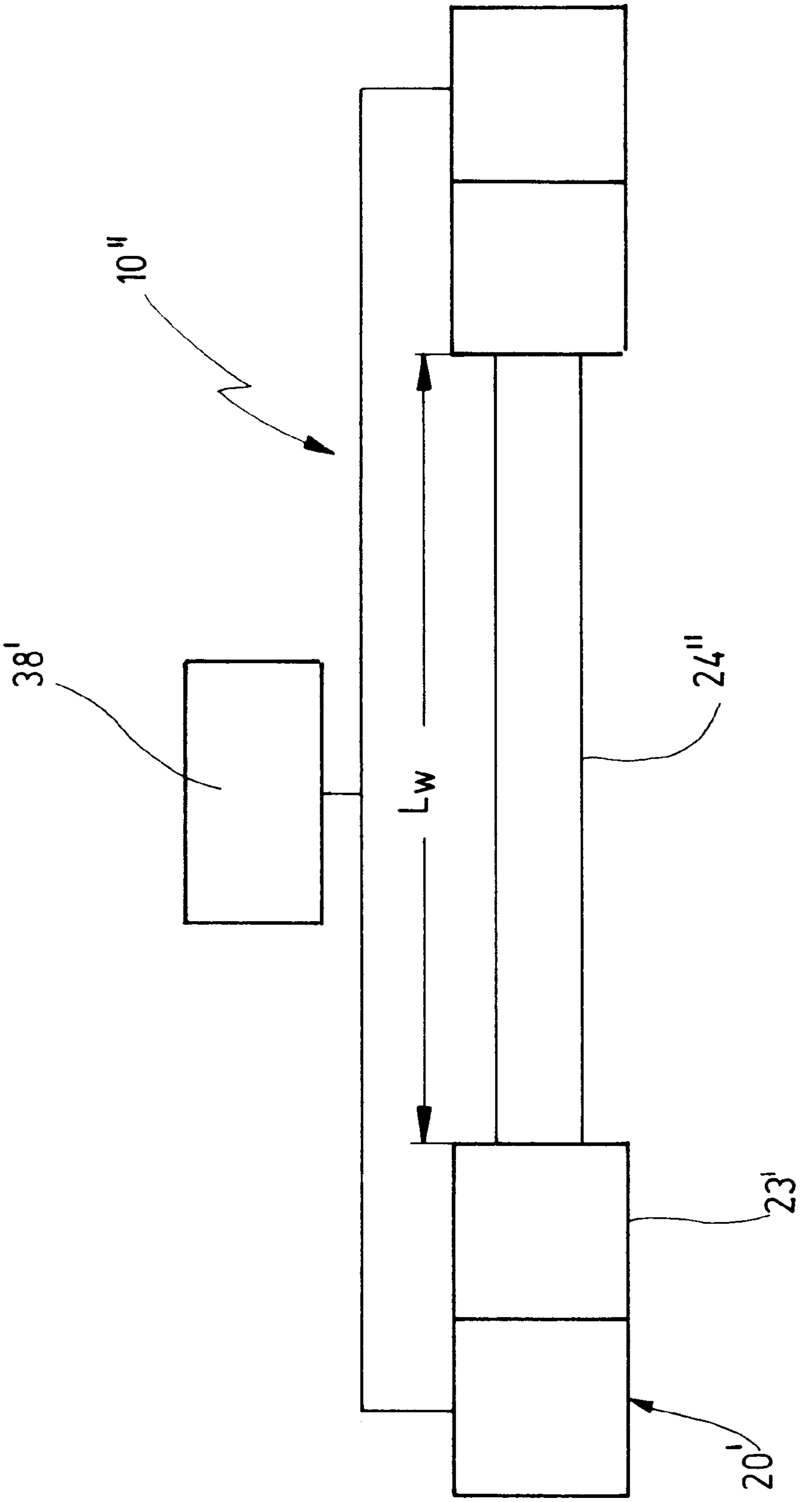

The as further illustrative embodiment in FIG. 4, to which now reference may be made, in greatly simplified schematically form represented device 10", which is substantially analogous with the device 10 according to FIG. 2 both in constructive as well also in functional respect and differs from this essentially therein, that on both ends of its tubular shaped cavity resonator 24" respectively an acoustically weak on the cavity resonator 24" coupled transducer and wave guide 23' of the on the basis of FIG. 2 discussed types is provided, in order to achieve higher amplitudes of the transverse oscillations of the cavity resonator 24".

The—not individually represented—piezo-ceramic cells or magneto strictive converters of this transducer 20' and wave guide 23' are by means of the alternating current generator 35' so driven, that they are excited to counterphasic oscillations.

The condition, that the cavity resonator 24' satisfies both the resonance condition for longitudinal resonance oscillations as well also for the transverse resonance oscillations, is in the device 10" according to FIG. 4 thereby achievable, that the length $L_w$ of the cavity resonator 24" is selected according to the relationship $$L'_w = \frac{(n-1)Co}{2fr}\left[1 - 4v^2\left(\frac{Do - \delta}{Do}\right)^2\right] + \frac{Co}{\pi fr}\left[1 - 4v^2\left(\frac{Do - \delta}{Do}\right)^2 \operatorname{arctg}\frac{\delta(Do - \delta)}{\delta(Do - \delta_1)}\right. \tag{4}$$

in which with n a whole number ≧2 is represented.

Should the cavity resonator 24" of the device 10" according to FIG. 4 be driven with the full symmetric broadcasting characteristic according to FIG. 3*a*, so is the cavity resonator 24" so arranged or designed, that in addition to the relation (4) the relation $$L'_w = \frac{\left(n - \frac{1}{2}\right)\pi Do\left[1 - 4v^2\left(1 - \frac{\delta}{Do}\right)^2\right]\left(1 - \frac{\delta}{Do}\right)}{2\sqrt{1 - v^2}} \tag{5'''}$$

is satisfied.

Should on the other hand, the device 10" according to FIG. 4 be driven with oscillation shapes of lower axial symmetry of its cavity resonator 24", then the cavity resonator 24" is so designed, that its length $L_w'$ in addition to the relationship (4) also satisfies the condition $$Lw' = \frac{\left(n - \frac{1}{2}\right)\pi^2\sqrt{3}\left[1 - 4v^2\left(1 - \frac{\delta}{Do}\right)^2\right]\left(1 - \frac{\delta}{Do}\right)^2 Do}{P^2\left(\frac{\delta}{Do}\right)\sqrt{1 - v^2}} \tag{6'''}$$

The devices 10' and 10" explained by reference to FIGS. 1, 2 and 4 can be employed for cleansing of workpieces, for stimulating chemical reactions, for mixing multiple fluids or pasty components of food stuffs, for emulsification and the like.

A—not represented variation of the illustrative embodiments according FIG. 1 and 2 can also therein be comprised, that the resonator 24 or the resonator 24' on its end be closed off, for example by a plate, which is fixedly connected to the resonator tube.

As long as the thickness of this closure plate is small relative to the half wave length of the oscillating wave in the resonating tube, there is also with such a closed resonator the same results achieved, which have been discussed on the basis of the embodiments according to FIG. 1 and 2.

We claim:

1. Device (10) for transmission of ultrasound into a fluid or pasty medium, comprised of the following functional elements:

a) an alternating current generator (35), which is designed for frequencies of between 1 kHz and 100 kHz, b) magnetostrictive or piezo-electric transducer (20) driveable with the alternating current output of the generator to high frequency—longitudinal—mechanical oscillation, c) a cylindrical rod shaped wave guide (23) which is excitable via the transducer to longitudinal resonance oscillations, and d) a tubular shaped cavity resonator (24) coupled acoustically with the wave guide, which converts the longitudinal resonant oscillations in regard to its longitudinal axis into transverse oscillations, of which the oscillation energy is transmittable to the medium to be treated with ultrasound, wherein e) the cavity resonator (24) is so designed, that in respect to the longitudinal as well also with respect to the transverse it satisfies the natural resonance period of its jacket (36), thereby characterized, that in the case of a mechanically substantially rigidly—"strong"—coupling of the wave guide (23) with the cavity resonator the length L of the cavity resonator coupled on the wave guide (23) is selected according to the relationship $$L = \frac{nc_0}{2fr}\left[1 - 4v^2\left(\frac{Do - \delta}{Do}\right)^2\right] \tag{2}$$

in which

V is the Poissonic transverse contraction coefficient, with $D_0$: is the outer diameter of the cavity resonator 24, δ: is the wall thickness of the jacket 36 of the cavity resonator (24), $f_r$: is the resonance frequency of the cavity resonator 24, n: is a whole numeral ≧1 (and)

$c_0$: is the sound velocity in a rod shaped resonator, wherein this sound velocity $c_0$ for its part is given by the relationship $$c_0 = \sqrt{\frac{E}{\rho}}$$

in which E represents the coefficient of elasticity (Youngs Modulus) of the material of the hollow cavity resonator (24) and δ represents the thickness thereof.

2. Device (10') for transmission or coupling of ultrasound in fluid or pasty medium, comprised of the following functional elements:

a) an alternating current generator, which is designed for frequencies of between 1 kHz and 100 kHz, b) magnetostrictive or piezo-electric transducer driveable with the alternating current output of the generator to high frequency—longitudinal—mechanical oscillation, c) a cylindrical rod shaped wave guide (23) which is excitable via the transducer to longitudinal resonance oscillations d) a tubular shaped cavity resonator (24") coupled acoustically with the wave guide, which converts the longitudinal resonant oscillations in regard to its longitudinal axis into transverse oscillations, of which the oscillation energy is transmittable to the medium to be treated with ultrasound, wherein e) the cavity resonator (24') is so arranged or designed, that both with respect to the longitudinal as well also with respect to transverse it satisfies the natural resonance period of vibration of its jacket (36'), thereby characterized, that in the case of an acoustic weak coupling of the cavity resonator (24') to the wave guide (23') the resonator length $L_w$ is selected according to the equation $$L_w = \frac{nc_0}{2fr}\left[1 - 4v^2\left(\frac{Do-\delta}{Do}\right)^2\right] + \frac{Co}{2\pi fr}\left[1 - 4v^2\left(\frac{Do-\delta}{Do}\right)^2 \text{arctg}\frac{\delta(do-\delta)}{\delta_1(Do-\delta_1)}\right] \quad (3)$$

in which

V is the Poissonic transverse contraction coefficient, $D_0$: is outer diameter of the cavity resonator (24"), δ: is the wall thickness of the jacket 36 of the cavity resonator (24"), $f_r$: is the resonance frequency of the cavity resonator (24"), n: is a whole numeral ≧1 (and)

$c_0$: is the sound velocity in a rod shaped resonator, wherein this sound velocity $c_0$ for its part is given by the relationship $$c_0 = \sqrt{\frac{E}{\rho}}$$

in which E is the coefficient of elasticity (Youngs Modulus) of the material of the hollow cavity resonator (24") and ρ is the thickness thereof, and $\delta_1$ is, with respect to the thickness δ of the section (36') of the resonator jacket for mediating the transmission of the sonic energy to the medium to be treated, the reduced thickness of a transducer-side jacket segment (36"), of which the outer diameter likewise has the value $D_0$ and of which the length corresponds to ⅛ of the sound wave length $\lambda_x$ during the resonant excitation of the hollow cavity resonator (24').

3. Device (10") for transmission or coupling of ultrasound in fluid or pasty medium, comprised of the following functional elements:

a) an alternating current generator (35), which is designed for frequencies of between 1 kHz and 100 kHz, b) magnetostrictive or piezo-electric transducer (20) driveable with the alternating current output of the generator to high frequency—longitudinal—mechanical oscillation, c) a cylindrical rod shaped wave guide (23) which is excitable via the transducer to longitudinal resonance oscillations, and d) a tubular shaped cavity resonator (24") coupled acoustically with the wave guide, which converts the longitudinal resonant oscillations in regard to its longitudinal axis into transverse oscillations, of which the oscillation energy is transmittable to the medium to be treated with ultrasound, wherein e) the cavity resonator (24") is so designed, that in respect to the longitudinal as well also with respect to the transverse it satisfies the natural resonance period of its jacket (36"), thereby characterized, that in the design of the device (10"), in which the cavity resonator (24") is from both sides via weakly coupled or attached transducers excitable to resonant transverse oscillations, the resonator length $L_w$ is determined according to the relationship $$L'_w = \frac{(n-1)Co}{2fr}\left[1 - 4v^2\left(\frac{Do-\delta}{Do}\right)^2\right] + \frac{Co}{\pi fr}\left[1 - 4v^2\left(\frac{Do-\delta}{Do}\right)^2 \text{arctg}\frac{\delta(Do-\delta)}{\delta(Do-\delta_1)}\right] \quad (4)$$

in which

V is the Poissonic transverse contraction coefficient, $D_0$: is outer diameter of the cavity resonator (24"), δ:is the wall thickness of the jacket 36 of the cavity resonator (24"), $f_r$: is the resonance frequency of the cavity resonator (24"), n: is a whole numeral ≧1 (and)

$c_0$: is the sound velocity in a rod shaped resonator, wherein this sound velocity $c_0$ for its part is given by the relationship $$c_0 = \sqrt{\frac{E}{\rho}}$$

in which E is the coefficient of elasticity (Youngs Modulus) of the material of the hollow cavity resonator (24") and ρ is the thickness thereof, and $\delta_1$ is, with respect to the thickness δ of the section (36') of the resonator jacket for mediating the transmission of the sonic energy to the medium to be treated, the reduced thickness of a transducer-side jacket segment (36"), of which the outer diameter likewise has the value $D_0$ and of which the length corresponds to ⅛ of the sound wave length $\lambda_x$ during the resonant excitation of the hollow cavity resonator (24").

4. Device according to claim 1, thereby characterized, that the length L of the cavity resonator (24) in addition to relationship (2) also satisfies the relationship:

$$L = \frac{n\pi Do\left[1 - 4v^2\left(1 - \frac{\delta}{Do}\right)^2\right]\left(1 - \frac{\delta}{Do}\right)}{2\sqrt{1 - v^2}}. \tag{5'}$$

5. Device according to claim 2, thereby characterized, that the length of the cavity resonator (24') in addition to relationship (3) also satisfies the relationship:

$$L_w = \frac{\left(n - \frac{1}{4}\right)\left[1 - 4\left(v^2\left(1 - \frac{\delta}{Do}\right)\right)^2\right]\left(1 - \frac{\delta}{Do}\right)\pi Do}{2\sqrt{1 - v^2}}.$$

6. Device according to claim 3, thereby characterized, that the length $L_w$ of the cavity resonator (24") in addition to the relationship (4) also satisfies the relationship:

$$L'_w = \frac{\left(n - \frac{1}{2}\right)\pi Do\left[1 - 4v^2\left(1 - \frac{\delta}{Do}\right)^2\right]\left(1 - \frac{\delta}{Do}\right)}{2\sqrt{1 - v^2}}. \tag{5'''}$$

7. Device according to claim 1, thereby characterized, that the length of the cavity resonator (24) in addition to relationship (2) also satisfies the relationship:

$$L = \frac{n\pi^2\sqrt{3}\left[1 - 4v^2\left(1 - \frac{\delta}{Do}\right)^2\right]\left(1 - \frac{\delta}{Do}\right)^2 Do}{P^2\left(\frac{\delta}{Do}\right)\sqrt{1 - v^2}} \tag{6'}$$

in which with p a whole number ≧1.

8. Device according to claim 2, thereby characterized, that the length $L_w$ of the cavity resonator (24") in addition to the relationship (3) also satisfies the relationship:

$$L_w = \frac{\left(n - \frac{1}{4}\right)\pi^2\sqrt{3}\left[1 - 4v^2\left(1 - \frac{\delta}{Do}\right)^2\right]\left(1 - \frac{\delta}{Do}\right)^2 Do}{P^2\sqrt{1 - v^2}\left(\frac{\delta}{Do}\right)} \tag{6''}$$

in which with p represents a whole number ≧1.

9. Device according to claim 3, thereby characterized, that the length $L_w$ of the cavity resonator (24") in addition to the relationship (4) also satisfies the relationship:

$$Lw' = \frac{\left(n - \frac{1}{2}\right)\pi^2\sqrt{3}\left[1 - 4v^2\left(1 - \frac{\delta}{Do}\right)^2\right]\left(1 - \frac{\delta}{Do}\right)^2 Do}{P^2\left(\frac{\delta}{Do}\right)\sqrt{1 - v^2}}. \tag{6'''}$$

* * * * *